United States Patent
Scheibel

(10) Patent No.: US 11,746,052 B2
(45) Date of Patent: *Sep. 5, 2023

(54) MULTI-COMPONENT COMPOSITION FOR PRODUCING AN AQUEOUS COATING MASS

(71) Applicant: Heraeus Deutschland GmbH & Co. KG, Hanau (DE)

(72) Inventor: Markus Scheibel, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/844,261

(22) Filed: Jun. 20, 2022

(65) Prior Publication Data

US 2022/0315491 A1 Oct. 6, 2022

Related U.S. Application Data

(62) Division of application No. 16/629,778, filed as application No. PCT/EP2018/059820 on Apr. 18, 2018, now abandoned.

(30) Foreign Application Priority Data

Jul. 31, 2017 (EP) ..................................... 17183916
Nov. 8, 2017 (EP) ..................................... 17200561

(51) Int. Cl.

| | |
|---|---|
| C04B 28/34 | (2006.01) |
| B28B 1/24 | (2006.01) |
| B28B 11/24 | (2006.01) |
| C04B 14/04 | (2006.01) |
| C04B 24/06 | (2006.01) |
| C04B 24/12 | (2006.01) |
| H01L 21/56 | (2006.01) |
| H01L 23/29 | (2006.01) |
| H05K 5/06 | (2006.01) |
| C04B 12/02 | (2006.01) |
| C04B 111/00 | (2006.01) |

(52) U.S. Cl.
CPC ................ *C04B 28/34* (2013.01); *B28B 1/24* (2013.01); *B28B 11/24* (2013.01); *C04B 12/02* (2013.01); *C04B 14/046* (2013.01); *C04B 24/06* (2013.01); *C04B 24/126* (2013.01); *H01L 21/56* (2013.01); *H01L 23/291* (2013.01); *H05K 5/065* (2013.01); *C04B 2111/00482* (2013.01); *C04B 2111/00844* (2013.01)

(58) Field of Classification Search
CPC ....... C04B 28/34; C04B 12/02; C04B 14/046; C04B 24/06; C04B 24/126; C04B 14/06; C04B 14/062; C04B 14/30; C04B 14/303; C04B 14/304; C04B 14/308; C04B 14/309; C04B 22/062; C04B 22/064; C04B 40/065; C04B 2111/00482; C04B 2111/00844; C04B 2111/00086; C04B 2111/00525; B28B 1/24; B28B 11/24; H01L 21/56; H01L 23/291; H01L 23/31; H01L 23/29; H05K 5/065

See application file for complete search history.

(56) References Cited

U.S. PATENT DOCUMENTS

| | | |
|---|---|---|
| 4,786,328 A | 11/1988 | Weill et al. |
| 10,593,608 B2 | 3/2020 | Eisele et al. |
| 11,091,394 B2 | 8/2021 | Scheibel et al. |
| 2007/0027224 A1 | 2/2007 | Cowan et al. |
| 2011/0143910 A1 | 6/2011 | Wagh et al. |
| 2015/0239784 A1 | 8/2015 | Cowan |
| 2017/0183556 A1 | 6/2017 | Agapiou et al. |

FOREIGN PATENT DOCUMENTS

| | | |
|---|---|---|
| CN | 102781871 A | 11/2012 |
| CN | 105837159 A | 8/2016 |
| CN | 106415820 A | 2/2017 |
| DE | 102013102301 A1 | 9/2014 |
| EP | 0236617 A1 | 9/1987 |
| EP | 0236617 B1 | 9/1990 |

(Continued)

OTHER PUBLICATIONS

Office Action dated Sep. 30, 2022 in EP Application No. 18717074.1.
Office Action dated Jun. 6, 2022 in CN Application No. 201880050534.1.
Int'l Search Report and Written Opinion dated Jun. 14, 2018 in Int'l Application No. PCT/EP2018/059820, translation of Search Report only.
Office Action dated Oct. 31, 2019 in TW Application No. 107126033.
Office Action dated Dec. 22, 2020 in JP Application No. 2019570809.

(Continued)

*Primary Examiner* — Anthony J Green
(74) *Attorney, Agent, or Firm* — Panitch Schwarze Belisario & Nadel LLP

(57) ABSTRACT

A composition is provided. The composition consists essentially of (a) 1 to 30 wt. % of a hydrogen phosphate selected from the group consisting of mono and dihydrogen phosphates of sodium, potassium, ammonium, magnesium, calcium, aluminium, zinc, iron, cobalt, and copper; (b) 1 to 40 wt. % of a compound selected from the group consisting of oxides, hydroxides, and oxide hydrates of magnesium, calcium, iron, zinc, and copper; (c) 40 to 95 wt. % of a particulate filler selected from the group consisting of glass; mono-, oligo- and poly-phosphates of magnesium, calcium, barium and aluminum; calcium sulfate; barium sulfate; simple and complex silicates; simple and complex aluminates; simple and complex titanates; simple and complex zirconates; zirconium dioxide; titanium dioxide; aluminum oxide; silicon dioxide; silicon carbide; aluminum nitride; boron nitride and silicon nitride; and (d) 0 to 25 wt. % of a constituent that differs from constituents (a) to (c).

9 Claims, No Drawings

(56) References Cited

FOREIGN PATENT DOCUMENTS

| EP | 1044942 A1 | 10/2000 |
|----|------------|---------|
| GB | 2186277 A | 8/1987 |
| JP | S62187105 A | 8/1987 |
| JP | 2017520111 A | 7/2017 |
| KR | 20170020448 A | 2/2017 |
| WO | 2015193035 A1 | 12/2015 |
| WO | 2016102868 A2 | 6/2016 |

OTHER PUBLICATIONS

Office Action dated Aug. 3, 2021 in JP Application No. 2019570809 (with Parial English Summary).
Office Action dated Sep. 14, 2021 in KR Application No. 1020207005033.
Office Action dated Jan. 11, 2022 in CN Application No. 201880050534.1.
Office Action dated Apr. 26, 2022 in U.S. Appl. No. 16/629,778 by Scheibel.

MULTI-COMPONENT COMPOSITION FOR PRODUCING AN AQUEOUS COATING MASS

CROSS-REFERENCE TO RELATED APPLICATIONS

This application is a Divisional of U.S. patent application Ser. No. 16/629,778, filed Jan. 9, 2020, now abandoned, which is a Section 371 of International Application No. PCT/EP2018/059820, filed Apr. 18, 2018, which was published in the German language on Feb. 7, 2019, under International Publication No. WO 2019/025039 A1, which claims priority under 35 U.S.C. § 119(b) to European Application No. 17183916.0, filed Jul. 31, 2017, and European Application No. 17200561.3, filed Nov. 8, 2017, the disclosures of each of which are incorporated herein by reference in their entireties.

The invention relates to a two- or multi-component composition that can be converted, by mixing with water, into an aqueous, hydraulically curable preparation that can be used as an enclosing mass. The aqueous enclosing mass can be used for production of a hydraulically cured enclosure of an electronic component.

The term "electronic component" used herein comprises, aside from passive electronic components, in particular semiconductor modules and, amongst the latter, in particular power electronic sub-assemblies.

Semiconductor modules shall be understood herein to be electronic or power electronic sub-assemblies comprising at least one substrate (as circuit carrier), at least one semiconductor component (semiconductor) and, if applicable, at least one passive electronic component. In this context, the at least one semiconductor component can itself be partially or completely pre-enclosed, for example with a jacketing based on an epoxy resin.

Examples of substrates include IMS substrates (insulated metal substrates), DCB substrates (direct copper-bonded substrates), AMB substrates (active metal brazing substrates), ceramic substrates, metal ceramic substrates, PCBs (printed circuit boards), and leadframes.

Examples of semiconductor components include diodes, LEDs (light emitting diodes), dies (semiconductor chips), IGBTs (insulated-gate bipolar transistors), ICs (integrated circuits), and MOSFETs (metal-oxide-semiconductor field-effect transistors). The semiconductor component or components specifically is/are semiconductor(s) that develop significant heat due to a power loss during their intended operation, i.e. semiconductors that reach self-destructing temperatures of, for example, 100 to >200° C. in the absence of an enclosure or encapsulation.

Examples of passive electronic components include sensors, floor plates, cooling bodies, resistors, capacitors, transformers, throttles, and coils.

The term "hydraulic curing" used herein comprises a process of setting in the presence of water or following the addition of water.

GB 2 186 227 A discloses a two-component system that can be used for the production of a curable cement, comprising, as first component, an aqueous solution comprising phosphoric acid, aluminium dihydrogen phosphate and an alkali, alkaline earth or aluminium salt of an acid at least as strong as phosphoric acid and, as second component, a metal oxide curing agent such as magnesium oxide.

US 2015/239784 A1 discloses curable cements that can be used for closing deep sea bore-holes and can be produced by mixing a liquid aqueous mixture comprising magnesium oxide and a second liquid aqueous mixture comprising phosphoric acid or hydrogen phosphate.

Powdered compositions and aqueous and closing masses that can be produced from them in the form of phosphate cement are disclosed, for example, in WO 2015/193035 A. Enclosures of electronic components produced from said aqueous phosphate cement-enclosing masses serve, in particular, for electrical insulation and heat dissipation from the electronic component to the outside during operation.

As has been evident surprisingly and is evident from the disclosure below, it may be expedient, in particular, with a view to a production of aqueous phosphate cement-enclosing masses and their use for the production of enclosures, in particular of enclosures of electronic components, at an industrial scale to provide compositions, in the form of a two- or multicomponent system, from which aqueous preparations can be produced that can be used as phosphate cement-enclosing masses.

The invention relates to a composition consisting of the following constituents:

(a) 1 to 30 wt. % (percent by weight) of at least one hydrogen phosphate selected from the group consisting of mono and dihydrogen phosphates of sodium, potassium, ammonium, magnesium, calcium, aluminium, zinc, iron, cobalt, and copper; if applicable, in combination with 1 to 90 wt-% aqueous phosphoric acid ($H_3PO_4$);

(b) 1 to 40 wt. % of at least one compound selected from the group consisting of oxides, hydroxides, and oxide hydrates of magnesium, calcium, iron, zinc, and copper;

(c) 40 to 95 wt. % of at least one particulate filling agent selected from the group consisting of glass; mono-, oligo- and poly-phosphates of magnesium, calcium, barium and aluminium; calcium sulfate; barium sulfate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide; aluminium oxide; silicon dioxide; silicon carbide; aluminium nitride; boron nitride and silicon nitride; and (d) 0 to 25 wt. % of at least one constituent that differs from constituents (a) to (c);

whereby constituent (a) can comprise up to 10 wt. % free water, relative to the total of constituent (a);

whereby constituent (d) can comprise up to 10 wt. % free water, relative to the total of constituent (d);

whereby the composition is present as a two- or multi-component system, and whereby constituents (a) and (b) are present essentially separate from each other or, if constituent (a) comprises phosphoric acid, are present separate from each other.

The composition consisting of constituents (a) to (c) or (a) to (d) is therefore present in the form of two or more components, i.e. components that differ and are separate from each other (components stored or to be stored separate from each other).

In other words, the invention relates to a system of two or more different components comprising no other than the following constituents:

(a) 1 to 30 wt. % of at least one hydrogen phosphate selected from the group consisting of mono and dihydrogen phosphates of sodium, potassium, ammonium, magnesium, calcium, aluminium, zinc, iron, cobalt, and copper; if applicable, in combination with 1 to 90 wt-% aqueous phosphoric acid;

(b) 1 to 40 wt. % of at least one compound selected from the group consisting of oxides, hydroxides, and oxide hydrates of magnesium, calcium, iron, zinc, and copper;

(c) 40 to 95 wt. % of at least one particulate filling agent selected from the group consisting of glass; mono-, oligo- and poly-phosphates of magnesium, calcium, barium and aluminium; calcium sulfate; barium sulfate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide; aluminium oxide; silicon dioxide; silicon carbide; aluminium nitride; boron nitride and silicon nitride; and (d) 0 to 25 wt. % of at least one constituent that differs from constituents (a) to (c);

whereby constituent (a) can comprise up to 10 wt. % free water, relative to the total of constituent (a);

whereby constituent (d) can comprise up to 10 wt. % free water, relative to the total of constituent (d);

whereby constituents (a) and (b) are present essentially separate from each other or, if constituent (a) comprises phosphoric acid, are present separate from each other.

Accordingly, the invention relates to a two- or multicomponent composition consisting of said constituents (a) to (c) and, if present, (d) also. In general, the number of components will not exceed five. A two-component composition is preferred. The components, taken together, comprise all constituents (a) to (c) or possibly (a) to (d). The components are stored separate from each other until they are used for the production of an aqueous hydraulically curable preparation that comprises all constituents (a) to (c) or possibly (a) to (d). The production of said preparation requires the addition of and/or the mixing with water.

If constituent (a) comprises phosphoric acid, the constituents (a) to (c) or possibly (a) to (d) or sub-constituents thereof can be distributed freely over the components of the two- or multicomponent composition according to the invention provided the essential condition for the invention in this exemplary embodiment requiring the constituents (a) and (b) to be present separate from each other, i.e. totally separate from each other, in different components, is met. In one embodiment, the invention relates specifically to a multicomponent system consisting of a component comprising the entire phosphoric acid-containing constituent (a), a further component comprising 90 or more wt. % of constituent (b), preferably all of constituent (b), as well as, if applicable, one or more further components, whereby at least one of the components comprises constituents (c) and, if present, (d) or their sub-constituents. In one embodiment, the invention relates specifically to a two-component system consisting of a component comprising all of phosphoric acid-containing constituent (a) and a second component comprising 90 or more wt. % of constituent (b), preferably all of constituent (b), whereby at least one of the two components comprises constituents (c) and, if present, (d) or their sub-constituents.

If constituent (a) does not comprise phosphoric acid, the constituents (a) to (c) or possibly (a) to (d) or sub-constituents thereof can be distributed freely over the components of the two- or multicomponent composition according to the invention provided the essential condition for the invention in this exemplary embodiment requiring the constituents (a) and (b) to be present at least essentially separate from each other is met. "Essentially" shall be understood to mean that at least 90 wt. % of all of the phosphoric acid-free constituent (a), preferably all of the phosphoric acid-free constituent (a), are present such as to be separate from constituent (b) and vice versa. In other words, a maximum of 10 wt. % of the phosphoric acid-free constituent (a) may be present in components, which also contain fractions of constituent (b); this applies analogously to constituent (b). Preferably, constituents (a) and (b) are present separate from each other, i.e. completely separate from each other, in different components. In one embodiment, the invention relates specifically to a multicomponent system consisting of a component comprising 90 or more wt. % of the phosphoric acid-free constituent (a), but preferably all of the phosphoric acid-free constituent (a), a further component comprising 90 or more wt. % of constituent (b), preferably all of constituent (b), as well as, if applicable, one or more further components, whereby at least one of the components comprises constituents (c) and, if present, (d) or their sub-constituents. Preferably, this concerns a two-component system consisting of a component comprising 90 or more wt. % of the phosphoric acid-free constituent (a), but preferably all of the phosphoric acid-free constituent (a) and a second component comprising 90 or more wt. % of constituent (b), preferably all of constituent (b), whereby at least one of the two components comprises constituents (c) and, if present, (d) or their sub-constituents.

Each of the constituents (a) to (d) can comprise one or more different ingredients, which shall be referred to as sub-constituents hereinafter.

In order to avoid mix-ups, a distinction is made herein between constituents (a) to (d), sub-constituents of said constituents, and components of the inventive two- or multicomponent composition.

Constituent (a), which accounts for 1 to 30 wt. %, preferably 2 to 15 wt. % of the two- or multi-component composition according to the invention, is at least one substance selected from the group consisting of sodium monohydrogen phosphate, potassium monohydrogen phosphate, ammonium monohydrogen phosphate, magnesium monohydrogen phosphate, calcium monohydrogen phosphate, aluminium monohydrogen phosphate, zinc monohydrogen phosphate, iron monohydrogen phosphate, cobalt monohydrogen phosphate, copper monohydrogen phosphate, sodium dihydrogen phosphate, potassium dihydrogen phosphate, ammonium dihydrogen phosphate, magnesium dihydrogen phosphate, calcium dihydrogen phosphate, aluminium dihydrogen phosphate, zinc dihydrogen phosphate, iron dihydrogen phosphate, cobalt dihydrogen phosphate, and copper dihydrogen phosphate; if applicable, in combination with 1 to 90 wt. % aqueous phosphoric acid (aqueous solution consisting of 1 to 90 wt. % phosphoric acid and the fraction of water adding up to a total of 100 wt. %). In other words, this concerns at least one hydrogen phosphate selected from the group consisting of mono- and dihydrogen phosphates of sodium, potassium, ammonium, magnesium, calcium, aluminium, zinc, iron, cobalt, and copper; if applicable, in combination with 1 to 90 wt-% aqueous phosphoric acid. Specifically, this concerns at least one hydrogen phosphate selected from the group consisting of mono- and dihydrogen phosphates of magnesium, potassium, aluminium, and ammonium.

A phosphoric acid-free constituent (a) or its sub-constituents preferably consists of solid particles, for example with particle sizes in the range of up to 1 mm.

Constituent (a) can comprise up to 10 wt. % free water, relative to the total of constituent (a). Referring to constituent (a), free water specifically is water that is not bound as crystalline water in the at least one hydrogen phosphate. The free water can originate, in particular, from aqueous phosphoric acid that may be present. Preferably, constituent (a) comprises no water or at least no free water. Specifically, constituent (a) comprises neither deliberately added water nor aqueous phosphoric acid.

Constituent (b), which accounts for 1 to 40 wt. %, preferably 2 to 15 wt. %, of the two- or multi-component composition according to the invention, is at least one compound selected from the group consisting of oxides, hydroxides, and oxide hydrates of magnesium, calcium, iron, zinc and copper, in particular at least one compound selected from the group consisting of magnesium oxide, iron oxide, and calcium oxide. Magnesium oxide is particularly preferred.

Constituent (b) or its sub-constituents preferably consist(s) of solid particles, for example with particle sizes in the range of up to 0.3 mm.

Constituent (b) comprises no free water and preferably no bound water either. In this context, water that can be expelled from oxide hydrates at elevated temperature shall not be considered to be bound water.

Constituent (c), which accounts for 40 to 95 wt. %, preferably 65 to 90 wt. %, of the two- or multi-component composition according to the invention, is at least one particulate filling agent selected from the group consisting of glass; mono-, oligo- and poly-phosphates of magnesium, calcium, barium and aluminium; calcium sulfate; barium sulfate; simple and complex silicates comprising sodium, potassium, calcium, aluminium, magnesium, iron and/or zirconium; simple and complex aluminates comprising sodium, potassium, calcium, magnesium and/or zirconium; simple and complex titanates comprising sodium, potassium, calcium, aluminium, magnesium, barium and/or zirconium; simple and complex zirconates comprising sodium, potassium, calcium, aluminium and/or magnesium; zirconium dioxide; titanium dioxide; aluminium oxide; silicon dioxide, in particular in the form of silicic acid and quartz; silicon carbide; aluminium nitride; boron nitride and silicon nitride. Zirconium silicate, silicic acid, and quartz are preferred.

Reference to mono-, oligo- and polyphosphates is made in the preceding section; in order to avoid mix-ups, it shall be understood that these are hydrogen-free phosphates unlike the hydrogen phosphates of constituent (a).

The preceding section differentiates between simple and complex silicates, aluminates, titanates, and zirconates. Rather than being complex compounds, the complex representatives to thereof are silicates, aluminates, titanates, and zirconates with more than one type of cations, such as, for example, sodium aluminium silicate, calcium aluminium silicate, lead zirconium titanate, etc.

The particle size of constituent (c) or its sub-constituents is in a range of, for example, 20 nm to 0.3 mm or even of 20 nm to 1 mm.

Constituent (c) comprises no free water and preferably no bound water either.

Constituent (d), which accounts for 0 to 25 wt. %, preferably 0 to 15 wt. % or 2 to 15 wt. %, of the two- or multicomponent composition according to the invention, is at least one constituent or sub-constituents that differ(s) from constituents (a) to (c). Examples include, in particular, additives such as flow-improving agents, setting retarders (pot life prolongers), defoaming agents, wetting agents, and adhesion promoters. Constituent (d) can comprise up to 10 wt. % free water, relative to the total of constituent (d). Preferably, constituent (d) comprises no water, or to be more specific, no deliberately added water.

Constituent (d) or its sub-constituents preferably consist(s) of solid particles, for example with particle sizes in the range of up to 0.3 mm or of even up to 1 mm. It is feasible, though not preferred, for constituent (d) to not be solid, but to be, for example, liquid or to comprise non-solid, for example liquid, sub-constituents.

The following table illustrates some exemplary formulations of preferred embodiments of two- or multicomponent compositions according to the invention.

| Constituent | Embodiment 1 | Embodiment 2 | Embodiment 3 |
|---|---|---|---|
| (a), in particular potassium and/or aluminium dihydrogenphosphate | 3-9 wt. % | 6-12 wt. % | 12-23 wt. % |
| (b), in particular magnesium oxide | 3-8 wt. % | 5-14 wt. % | 8-19 wt. % |
| (c), in particular zirconium silicate | 70-90 wt. % | 55-80 wt. % | 45-65 wt. % |
| (d) | 0-13 wt. % | 9-19 wt. % | 13-25 wt. % |

The two- or multicomponent composition according to the invention consist of constituents (a) to (c) or (a) to (d), i.e. the wt. % fractions of the constituents add up to a total of 100 wt. % of the two- or multicomponent composition according to the invention. If no constituent (d) is present, the wt. % fractions of constituents (a) to (c) add up to 100 wt. % of the two- or multicomponent composition according to the invention.

In one embodiment, the components of the two- or multicomponent system according to the invention are provided in a provided amount that corresponds to the above-mentioned quantitative ratio of constituents (a) to (c) or (a) to (d); in other words, the components are ready-aliquoted and can therefore be directly mixed with each other to form the one-component composition and/or additionally with water to form the aqueous hydraulically curable preparation without any weighing or measuring. If constituent (a) comprises aqueous phosphoric acid in this context, a one-component composition or aqueous hydraulically curable preparation produced as described can be stored only for short periods of time, for example only for 2 hours.

The two or more components of the two- or multicomponent composition according to the invention, which are to be mixed with each other or with water to form the aqueous hydraulically curable preparation, are preferably provided in the form of particles, for example in the form of a powder. This means that particulate or powdered components of the two- or multicomponent system according to the invention comprising more than one, i. e. two or more different constituents and/or subconstituents-comprising are present in an intimate mixture, in particular in the form of a stochastically homogeneous mixture; said particulate components preferably show no formation of lumps and can flow freely.

Particulate components of the two- or multicomponent composition according to the invention can be produced according to common methods for the production of free-flowing particulate compositions that are known to a person skilled in the art. Examples include the production processes of tumbler-mixing, intensive mixing, dry grinding, and air blending.

As mentioned above, the components of the two- or multicomponent composition according to the invention can be mixed with each other and with water to form an aqueous hydraulically curable preparation.

An aqueous hydraulically curable preparation, in particular an aqueous hydraulically curable preparation that can be used as an aqueous enclosing mass - i.e. ready-made - can be obtained by mixing the components of the two- or multicomponent composition according to the invention to produce one or more pre-mixtures followed by subsequent mixing with water. Accordingly, for example, initially all components of the two- or multicomponent system according to the invention can be mixed without adding water and subsequently can be mixed with water to produce the aqueous hydraulically curable preparation.

Alternatively, initially at least one of the components of the two- or multicomponent composition according to the invention can be mixed with water and can thus be converted into at least one aqueous intermediate. As a result, one obtains a two- or multicomponent system that differs from the original two- or multicomponent system (two- or multicomponent system derived from the original two- or multicomponent system; for short "derived two- or multicomponent system") comprising the at least one aqueous intermediate as well as the or the remaining components of the original two- or multicomponent system that have not been mixed with water. Accordingly, the components of the derived two- or multicomponent system thus formed can be mixed directly or while adding water to produce an aqueous hydraulically curable preparation, in particular to produce an aqueous hydraulically curable preparation that can be used as aqueous enclosing mass—i.g. ready-made.

A derived two- or multicomponent system can specifically assume the following embodiments (i), (ii) or (ii):

(i) Derived two- or multicomponent system comprising an aqueous component in the form of an aqueous intermediate A' comprising constituent (a) with no fractions of constituent (b) and a further aqueous component in the form of an aqueous intermediate B' comprising constituent (b) with no fractions of constituent (a). Said aqueous intermediate A' is characterised by a basically unlimited storage time, whereas the storage time of said aqueous intermediate B' generally is no more than 48 hours. Referring to a derived two-component system of type (i), its two aqueous and, for example liquid or pasty, components can be mixed by means of a suitable two-component mixing facility, for example by means of a static mixer (in particular of the Kenics or Ross ISG mixer type) to produce the aqueous hydraulically curable preparation, in particular to produce an aqueous hydraulically curable preparation that can be used as aqueous enclosing mass—i.e. ready-made, in particular in the scope of an industrial serial production, for example a serial production of the respective enclosures and/or enclosed electronic components. This type of usage of the derived two-component system of type (i) is suitable, in particular, for being carried out at the end-user's, at the user of the aqueous hydraulically curable preparation, which can be used, in particular, as aqueous enclosing mass—i.e. ready-made.

(ii) Derived two- or multicomponent system comprising a non-aqueous component comprising constituent (a) with no fractions of constituent (b) and an aqueous component in the form of an aqueous intermediate comprising constituent (b) with no fractions of constituent (a). As mentioned above, an aqueous intermediate of this type is characterised by its storage time being in general no more than 48 hours. An end-user can convert said derived two- or multicomponent system of type (ii) into a derived two- or multicomponent system of type (i) by converting the non-aqueous component, which comprises constituent (a) with no fractions of constituent (b), by mixing it with water.

(iii) Derived two- or multicomponent system comprising an aqueous component comprising constituent (a) with no fractions of constituent (b) and a non-aqueous component comprising constituent (b) with no fractions of constituent (a). The end-user can convert said derived two- or multicomponent system of type (iii) into a derived two- or multicomponent system of type (i) by converting the non-aqueous component, which comprises constituent (b) with no fractions of constituent (a), by mixing it with water.

In general, an aqueous hydraulically curable preparation of the type in question does not contain any excess of acid, in other words, in general the nature and amount of basic constituent (b) can be appropriate such that the acid equivalents provided by constituent (a) and any further acid equivalents from constituents (c) and (d) can at least be fully neutralised, preferably can be more than neutralised.

For example, a total of 100 parts by weight of the components, for example preferably of particulate components, of the two- or multicomponent composition according to the invention can be mixed with 5 to 30 parts by weight, preferably 6 to 15 parts by weight of water to produce the aqueous hydraulically curable preparation.

As mentioned above it is feasible to initially mix all components of the two- or multicomponent system according to the invention without adding water followed by mixing with water to produce the aqueous hydraulically curable preparation. However, it is preferred to initially mix at least one of the components with water to produce at least one aqueous intermediate and thus to generate a derived two- or multicomponent system. Subsequently, this can be mixed further with the further component(s) and/or the aqueous intermediate(s).

During the production of the aqueous hydraulically curable preparation involving the use of the two- or multicomponent composition according to the invention, the individual components of the preparation and the water can be mixed with each other in any order, including in aliquots, if applicable. It is feasible in this context to initially produce intermediate products in the form of one or more of the above-mentioned pre-mixtures from two or more components without adding water and/or in the form of one or two of the above-mentioned aqueous intermediates while adding water. In the case of aqueous intermediates, this may possibly concern aqueous solutions, for example aqueous solutions of constituents (a) or (d) or possible sub-constituents thereof. It can be expedient to produce aqueous intermediates containing constituent (b) and fractions of at least one acidic constituent (forming $H_3O^+$ ions in the presence of water) selected from constituents (a), (c), and (d) no longer than for example up to 2 to 24 hours before the final mixing to produce the ready-made aqueous hydraulically curable preparation. The same applies to aqueous intermediates that comprise constituent (b) or sub-constituents of constituent (b), but are free of acidic constituents or sub-constituents; in which case it is expedient to produce said aqueous intermediates no longer than for example up to 48 hours before the final mixing to produce the aqueous hydraulically curable preparation.

Examples of dynamic mixing processes that can be used during the final mixing to produce the aqueous hydraulically curable preparation through the use of the two- or multicomponent composition according to the invention include stirring and intensive mixing, for example intensive mixing through the use of planetary mixers.

In an embodiment, that is particularly expedient with a view to the use of the two- or multicomponent composition according to the invention on an industrial scale, the composition comprises only two components A and B. In this context, component A comprises constituent (a) and component B comprises constituent (b). This way, constituents (a) and (b) can be kept separate from each other during the storage of the two-component system according to the invention. In this context, constituents (c) and (d) can be contained in component A and/or B, whereby it is preferred to have approximately equal fractions of at least constituent (c) be present in the two components A and B. For example, 30 to 70 wt. %, preferably 40 to 60 wt. %, of constituent (c) can be present in component A and the remaining fraction can be present in component B. Moreover, it can be preferred for component B to contain no fractions of possible acidic constituents (c) and (d). Such possibly acidic substances are preferably contained exclusively in component A. The mixing with water to produce the aqueous hydraulically curable preparation can be performed according to the principles mentioned above. However, it is preferred to convert both components A and B each with water into a derived two-component system of the above-mentioned type (i) comprising aqueous intermediates A' and B' and to subsequently mix these with each other to produce the aqueous hydraulically curable preparation. This results in particular advantages with a view to the use on an industrial scale. A component A and/or an aqueous intermediate A' comprising constituent (a) with no fractions of constituent (b) can be stored for a basically unlimited period of time. An aqueous intermediate B', which is free of acidic substances and comprises component B and/or constituent (b), can generally be stored a period of time of at least 48 hours. Preferably, aqueous intermediates A' and B' can be formulated appropriately such that they have similar volumes with a view to their mixing ratio, for example volumes that differ by no more than 20% from each other (corresponding to a volume ratio of 1.2:1 to 1:1.2) and/or similar rheological properties, for examples viscosities in the range of 0.5 to 50 Pa·s (rotation viscosimetry, plate-plate measuring principle, plate diameter 25 mm, measuring gap 1 mm, sample temperature 20° C., shear rate 36 min$^{-1}$, viscosity value determined after a measuring time of 2 minutes). A mixture of both aqueous intermediates A' and B' represents an aqueous hydraulically curable preparation in the above-mentioned sense, it contacts components A and B and therefore constituents (a) and (b) with each other and has a pot life (processing period, time period of processability) expressed as the time until the initial viscosity has doubled (viscosity after 5 minutes calculated from the first contact of the two-component composition according to the invention and water) of in general up to 120 minutes. It is therefore expedient to provide the two aqueous intermediates A' and B' separately and to provide a substantial amount, which is generally processed within a time period of 48 hours and to perform the mixing of requisite aliquots of aqueous intermediates A' and B' before their use for the enclosing of electronic components, for example immediately or no longer than 120 minutes, preferably no longer than 10 minutes before. Examples of two-component mixing facilities that cannot only be used in this context, but are particularly well-suited, are the above-mentioned static mixers, whose outlet opening releases the required amount of the aqueous hydraulically curable preparation, either continuously or in aliquots, in the form of aqueous intermediates A' and B', which are mixed at the desired mixing ratio and are mixed such as to be sufficiently homogeneous, for the purpose of the intended use for the enclosing, in particular, of electronic components. For example, the desired mixing ratio of aqueous intermediates A' and B' can expediently correspond to the above-mentioned desired quantitative ratio of the two-component composition according to the invention and water, for example correspond to the above-mentioned quantitative ratio of 100 parts by weight of the two-component composition according to the invention: 5 to 30 parts by weight, preferably 6 to 15 parts by weight, of water.

As mentioned above, the aqueous, free-flowing, and hydraulically curable preparation can be used as an aqueous enclosing mass for electronic components. For short, the term "aqueous enclosing mass" shall be used hereinafter.

The aqueous enclosing mass can be used for production of a hydraulically cured enclosure of electronic components. The production process comprises the steps of:

(1) Providing an electronic component to be enclosed;

(2) providing an aqueous enclosing mass produced as mentioned above;

(3) enclosing the electronic component provided in step (1) in the aqueous enclosing mass provided in step (2); and (4) hydraulic curing of the aqueous enclosing mass enclosing the electronic component after completion of step (3).

Preferably, steps (1) to (4) and/or the process comprising steps (1) to (4) are implemented on an industrial scale, in the scope of an industrial serial production.

An electronic component to be enclosed is provided in step (1), for example a passive electronic component or a semiconductor module, the latter specifically in the form of a power electronic sub-assembly.

With regard to step (2), reference shall be made to what has been described above and/or above-mentioned embodiments. A step (2) that is implemented on an industrial scale preferably takes place during the mixing of aqueous intermediates A' and B' of a derived two-component system of type (i) through the use of a static mixer, in particular of the Kenics- or Ross-ISG mixer type. In this context, step (2) comprises the following sub-steps:

(2a) Providing a two-component composition according to the invention from a first component A comprising constituent (a) and a second component B comprising constituent (b);

(2b) separately mixing each of the components A and B with water to produce two separate aqueous intermediates A' and B'; and (2c) mixing aqueous intermediates A' and B' by means of a static mixer to produce an aqueous enclosing mass in the form of an aqueous hydraulically curable preparation. In this context, it is preferred for the two aqueous intermediates A' and B' to have volumes that differ by no more than 20% from each other and/or each to have a viscosity in the range of 0.5 to 50 Pa·s (rotation viscosimetry, plate-plate measuring principle, plate diameter 25 mm, measuring gap 1 mm, sample temperature 20° C., shear rate 36 min$^{-1}$, viscosity values determined after a measuring time of 2 minutes).

Preferably, step (3) is performed without delay, for example within 120 minutes, preferably within 10 minutes, of the completion of step (2).

Step (3) involves the enclosing of the electronic component provided in step (1) in the aqueous enclosing mass provided according to step (2). Potting, immersion, and injection moulding are preferred application methods. The potting can take place by means of common methods that are known to a person skilled in the art, for example by gravity potting, pressure-supported potting or pressure-reduced potting. It can be expedient in this context to surround the electronic component to be enclosed with half-shell moulds and to then fill these with the pourable enclosing mass. The enclosing take place as a partial or a complete enclosing. For example, the enclosing of a semiconductor module can be performed such that the enclosing compound partially or fully encloses electrical contacting elements, such as, for example, bond wires, ribbons and/or a substrate, that are connected to the semiconductor component. Partial enclosing shall be understood to mean that one or more of the contacting elements are incompletely enclosed and/or one or more of the contacting elements are not enclosed, whereas full enclosing shall be understood to mean that all contacting elements are fully enclosed. The potting can take place, for example, such that the enclosing compound is formed as "glob-top" known to a person skilled in the art.

In step (4), which follows after step (3), the aqueous enclosing mass enclosing the electronic component is cured hydraulically. To be more exact, the essential part of the hydraulic curing takes place during the setting process during step (4); it is self-evident that the hydraulic curing starts from the moment, in which constituents (a) and (b) contact each other in the presence of water, i.e. during step (2). A drying process, meaning the removal of water or of the water, can take place during and after the actual setting process. Setting and drying can take place, for example, for 30 to 300 minutes in a temperature range, for example, of 20 to 300° C.

If half-shell moulds are used in step (3), the enclosed electronic component can be removed from the half-shells after the hydraulic curing according to step (4) and once the half-shells are opened.

EXAMPLES

General Procedure:

Each component of the powdered solids compositions described in the table below were weighed in a beaker with a screw-on lid. The beaker was closed and then each component was homogenised individually by manual shaking and then added to water that had been placed into another beaker and this was homogenised for 5 minutes by intensive stirring to produce an aqueous intermediate. The mixing ratio for each aqueous intermediate was 100 parts by weight of the solids composition: 10 parts by weight of water. The aqueous intermediates thus obtained were placed into the measuring cell of a rheometer and the respective initial viscosity was determined in accordance with the information provided in the description above. Subsequently, both aqueous intermediates were combined at the specified mass ratio and were homogenised by intensive stirring to produce an aqueous enclosing mass. This was placed into the measuring cell of a rheometer and the pot life was determined in accordance with the information provided in the description above.

| | Example 1 | | Example 2 | |
|---|---|---|---|---|
| Constituent | Component A | Component B | Component A | Component B |
| (A) Potassium dihydrogen phosphate | 3.84 | 0 | 3.84 | 0 |
| (b) Magnesium oxide $D_{50}$ = 18 μm | 0 | 4.6 | 0 | 4.6 |
| (c) Zirconium silicate $D_{50}$ = 10 μm | 19.4 | 17.92 | 21.3 | 16 |
| (d1) Urea | 2.4 | 3.6 | 2.4 | 3.6 |
| (d2) L-Tartaric acid | 0.36 | 2.04 | 0.36 | 2.04 |
| (d3) Trisodium citrate trihydrate | 0.36 | 2.04 | 0.36 | 2.04 |
| Relative mass fraction of the aqueous intermediate | 1 | 1.13 | 1 | 1 |
| Initial viscosity of the aqueous intermediate [Pa · s] | 2 | 4 | 2 | 2.5 |
| Storage time of component B | | 50 h | | 50 h |
| Pot life of the enclosing mass | 50 min | | 50 min | |

$D_{50}$ = mean particle diameter

The invention claimed is:

1. A method for the production of a hydraulically cured enclosure of an electronic component, the method comprising the steps of:
   (i) providing an electronic component to be enclosed;
   (ii) providing an aqueous enclosing mass in the form of an aqueous hydraulically curable preparation produced according to a method comprising the steps of:
   mixing at least one component of a composition with water to produce at least one aqueous intermediate, and
   mixing the at least one aqueous intermediate with further component(s) of the composition and/or further aqueous intermediate(s),
   wherein the composition consists of the following constituents:
   (a) 1 to 30 wt. % of at least one hydrogen phosphate selected from the group consisting of mono and dihydrogen phosphates of magnesium, calcium, aluminum, zinc, iron, cobalt, and copper;
   (b) 1 to 40 wt. % of at least one compound selected from the group consisting of oxides, hydroxides, and oxide hydrates of magnesium, calcium, iron, zinc, and copper;
   (c) 40 to 95 wt. % of at least one particulate filling agent selected from the group consisting of glass; mono-, oligo- and poly-phosphates of magnesium, calcium, barium and aluminum; calcium sulfate; barium sulfate; simple and complex silicates comprising sodium, potassium, calcium, aluminum, magnesium, iron and/or zirconium; simple and complex aluminates comprising sodium, potassium, calcium, magnesium and/or zirconium; simple and complex titanates comprising sodium, potassium, calcium, aluminum, magnesium, barium and/or zirconium; simple and complex zirconates comprising sodium, potassium, calcium, aluminum and/or magnesium; zirconium dioxide; titanium dioxide; aluminum oxide; silicon dioxide; silicon carbide; aluminum nitride; boron nitride and silicon nitride; and
   (d) 0 to 25 wt. % of at least one constituent that differs from constituents (a) to (c),
   wherein constituents (a), (b) and (c) comprise no free water,
   wherein constituent (d) comprises no water,
   wherein the composition is present as a two-component system, and wherein constituents (a) and (b) are present separate from each other before the mixing steps;

(iii) enclosing the electronic component provided in step (i) in the aqueous enclosing mass provided in step (ii); and (iv) hydraulic curing the aqueous enclosing mass enclosing the electronic component after completion of step (iii).

2. The method according to claim 1, wherein the electronic component to be enclosed is a passive electronic component or a semiconductor module.

3. The method according to claim 1, wherein the method is implemented on an industrial scale.

4. The method according to claim 1, wherein step (ii) comprises the following sub-steps:
- (iia) providing the composition from a first component A comprising the constituent (a) and a second component B comprising the constituent (b);
- (iib) mixing component A with water to produce a first aqueous intermediate A' and separately mixing component B with water to produce a second aqueous intermediate B'; and
- (iic) mixing the first and second aqueous intermediates A' and B' using a static mixer to produce the aqueous enclosing mass in the form of the aqueous hydraulically curable preparation.

5. The method according to claim 4, wherein the first and second aqueous intermediates A' and B' have volumes that differ by no more than 20% from each other and/or each have a viscosity in the range of 0.5 to 50 Pa·s (rotation viscosimetry, plate-plate measuring principle, plate diameter 25 mm, measuring gap 1 mm, sample temperature 20° C., shear rate 36 $min^{-1}$, viscosity values determined after a measuring time of 2 minutes).

6. The method according to claim 1, wherein constituent (a) is at least one hydrogen phosphate selected from the group consisting of mono and dihydrogen phosphates of magnesium and aluminum.

7. The method according to claim 1, wherein constituent (b) is at least one compound selected from the group consisting of magnesium oxide, iron oxide, and calcium oxide.

8. The method according to claim 1, wherein constituent (c) is at least one particulate filling agent selected from the group consisting of zirconium silicate, silicic acid, and quartz.

9. The method according to claim 1, wherein the components of the two-component system are present in an amount that corresponds to the quantitative ratios of constituents (a) to (d).

* * * * *